(12) United States Patent
Cottin et al.

(10) Patent No.: US 7,271,632 B2
(45) Date of Patent: Sep. 18, 2007

(54) CONTROLLED SLOPE VOLTAGE RAMP GENERATOR

(75) Inventors: Denis Cottin, Crolles (FR); Christophe Garnier, Theys (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/989,097

(22) Filed: Nov. 12, 2004

(65) Prior Publication Data

US 2005/0206414 A1    Sep. 22, 2005

(30) Foreign Application Priority Data

Nov. 14, 2003   (FR) .................................. 03 13355

(51) Int. Cl.
   *H03K 4/06*   (2006.01)
(52) U.S. Cl. ...................................... 327/131; 327/140
(58) Field of Classification Search ................ 327/131, 327/132, 133, 134, 135, 136, 137, 138, 139, 327/140
See application file for complete search history.

(56) References Cited

U.S. PATENT DOCUMENTS

| 4,626,702 | A | 12/1986 | Chito | 327/132 |
| 6,876,244 | B1* | 4/2005 | Moraveji | 327/374 |
| 6,946,917 | B2* | 9/2005 | Raha | 331/16 |

FOREIGN PATENT DOCUMENTS

| JP | 03109812 | 5/1991 |
| JP | 04048812 | 2/1992 |
| JP | 06282338 | 10/1994 |

OTHER PUBLICATIONS

B. Kaczynski, "Sawtooth Generator Exhibits 1% Linearity and Over 80-dB Dynamic Range", Electronic Design, Penton Publishing, vol. 47, No. 15, Jul. 26, 1999, p. 84, XP000928126.
French Preliminary Search Report dated Jun. 2, 2004 for French Application No. 03 13355.

* cited by examiner

*Primary Examiner*—Quan Tra
*Assistant Examiner*—Khareem E. Almo
(74) *Attorney, Agent, or Firm*—Lisa K. Jorgenson; Stephen Bongini; Fleit Kain Gibbons Gutman Bongini & Bianco P.L.

(57) ABSTRACT

A ramp generator is provided that includes an amplifier, first and second transistors, a variable resistive load having a control electrode, and a capacitor. The amplifier has an inverting input that receives a first reference voltage, and an output connected to the gate of the first transistor. The first transistor has a source connected to a second reference voltage, and a drain connected to the non-inverting input of the amplifier and also to the variable resistive load. The second transistor mirrors the current of the first transistor so as to charge the capacitor, which is periodically discharged by a discharging circuit. In one embodiment, the generator further comprises a comparator, a filter, and an integrator that control the variable resistive load so as to generate a slope having characteristics that are noticeably independent from dispersion, from manufacturing methods, and temperature.

16 Claims, 7 Drawing Sheets

During stabilization phase

Vout

Vcomp

Vfilt

Vgate_n

After stabilization during stabilization phase after stabilization

CONTROLLED SLOPE VOLTAGE RAMP GENERATOR

CROSS-REFERENCE TO RELATED APPLICATIONS

This application is based upon and claims priority from French Patent Application No. 03 13355, filed Nov. 14, 2003, the entire disclosure of which is herein incorporated by reference.

FIELD OF THE INVENTION

The present invention relates to the field of electronic circuits, and more particularly to a controlled slope voltage ramp generator.

BACKGROUND OF THE INVENTION

Voltage ramp generators constitute basic elements of multiple electronic circuits and in particular in switched mode power supply circuits and choppers.

FIG. 1 illustrates the operating principle of a DC-DC converter—sometimes also called a switched mode power supply. Because of their high efficiency, such converters have become very popular and they are very frequently found in battery powered portable electronics. The voltage $V_{sense}$ that is delivered at the connection terminals of a load resistor 3 results from a current, controlled by two transistors 5 and 6, and filtered by an LC network 1 and 2. A recovery diode 4 drains the energy stored in inductive resistor 1 when transistors 5 and 6 are off. Generally, the transistors are controlled by a comparator (not shown) that receives a reference voltage on a first input and a ramp voltage on a second input, as shown in FIG. 2. By varying the reference voltage $V_{ref}$, the duty cycle between the current carrying time and the blocking period of transistor 5 is varied and, thus, voltage $V_{sense}$ on the connection terminals of resistor 3 is changed.

In modern electronic devices, power supply circuits must be able to provide currents that can vary in a broad range of values. For example, mobile telephones have supply currents that can vary from several hundred of milliamps (when the apparatus is operating) to only a few microamps (in suspend mode).

Such variation ranges impose difficult operating conditions for power supply circuits and in particular, the ramp generator must allow regulation on the whole ramp range, including at both ends that correspond to the previously mentioned extreme values.

However, known ramp generators cannot really operate in the whole operating range considered because of the dispersion of components' characteristics, which results in dispersion on the slope—as shown in FIG. 3—and this makes it difficult to precisely control supply current near the ends. With known circuits it is not rare to observe a 30% rate of dispersion on the slope of the ramp generator.

It is thus desirable to have a ramp generator that provides a very well regulated slope that hardly depends on dispersions of component characteristics. Thus, precise control of the supply current is ensured between voltages ranging from a few microamps to several hundred milliamps and, more generally, if the slope is very well regulated, the constraints on the other components of the electronic circuit can be slackened.

SUMMARY OF THE INVENTION

The object of the present invention is to provide a ramp generator that is simple to realize and provides a very well regulated slope that is not very sensitive to dispersions of characteristics of the generator's components.

Another object of the present invention is to provide a ramp generator circuit that generates a slope adapted to the realization of a DC/DC voltage converter.

One preferred embodiment of the present invention provides a ramp generator comprising a control circuit including a differential amplifier having an inverting input set to a reference voltage and an output connected to the gate of a first transistor, which has a source connected to a reference voltage and a drain connected to the non-inverting input of the amplifier. The drain is charged to a variable resistive load controlled by a control voltage. A second transistor mirrors the current of the first transistor in order to generate a copy current which is used to charge a capacitor that is periodically discharged by a discharging circuit.

In a preferred embodiment, the variable resistive load is a current divider comprising a first and a second branch. The first branch comprises a first resistor and the second branch comprises a second resistor mounted in series with a third transistor controlled by the control voltage.

Thus, a ramp generator is very simply realized whose charging current is controlled by control voltage, and the control voltage is generated, in the preferred embodiment, by a loop comprising a comparator, a low-pass filter and an integrator assembled in cascade.

In one embodiment, the control loop comprises, in cascade: a comparison block receiving the ramp signal generated at the terminals of the capacitor and outputting a comparison signal, a filtering block receiving the comparison signal and outputting a signal after low-pass filtering, and an integrating block receiving the signal and outputting an integrated value of the signal that is transmitted to the control electrode of the variable resistive load.

In preferred embodiments, resistors are made of non-silicide polycrystalline silicon (same material) and the capacitor is implemented by a MOS transistor.

Other objects, features and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
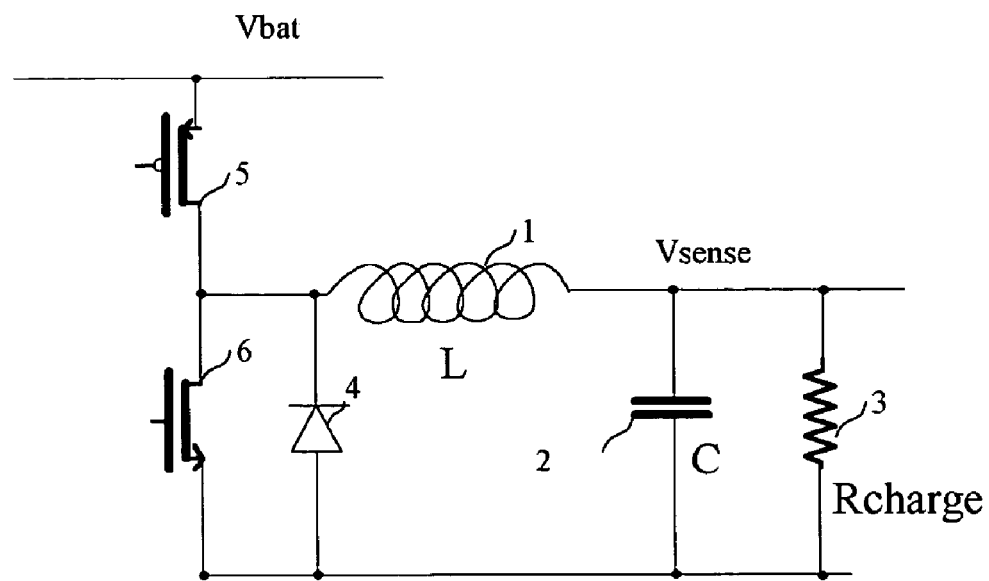
FIG. 1 illustrates the schematic diagram of a traditional DC-DC voltage converter based on a voltage generator.
Figure 2:
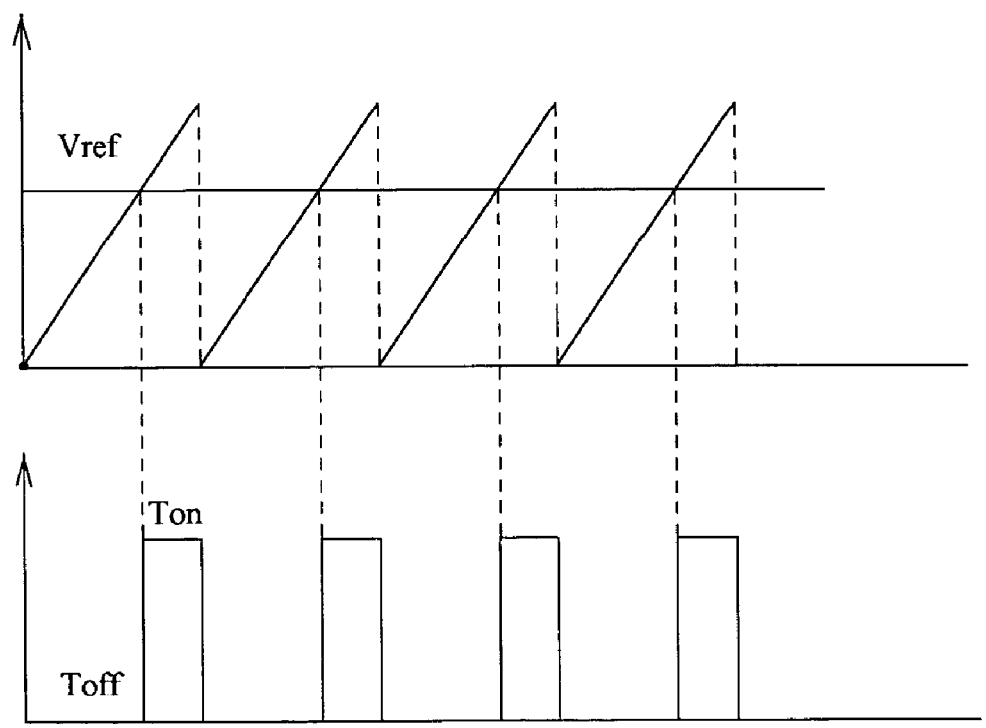
FIG. 2 shows chronograms of the generated voltage ramp and the resulting duty cycle.
Figure 3:
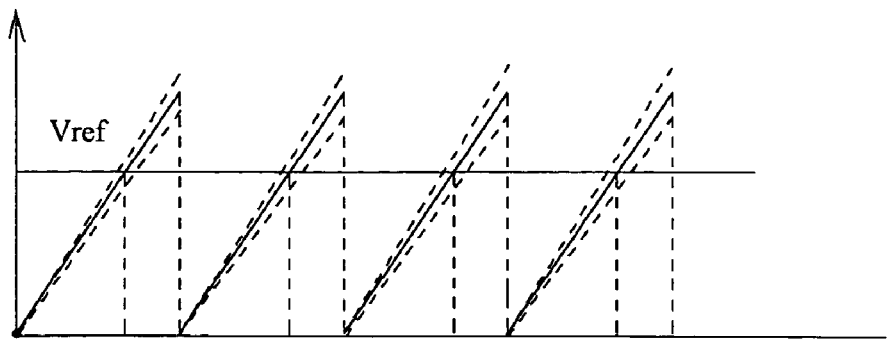
FIG. 3 illustrates the effect of component characteristic dispersion in modifying the slope of the ramp generator.
Figure 4:
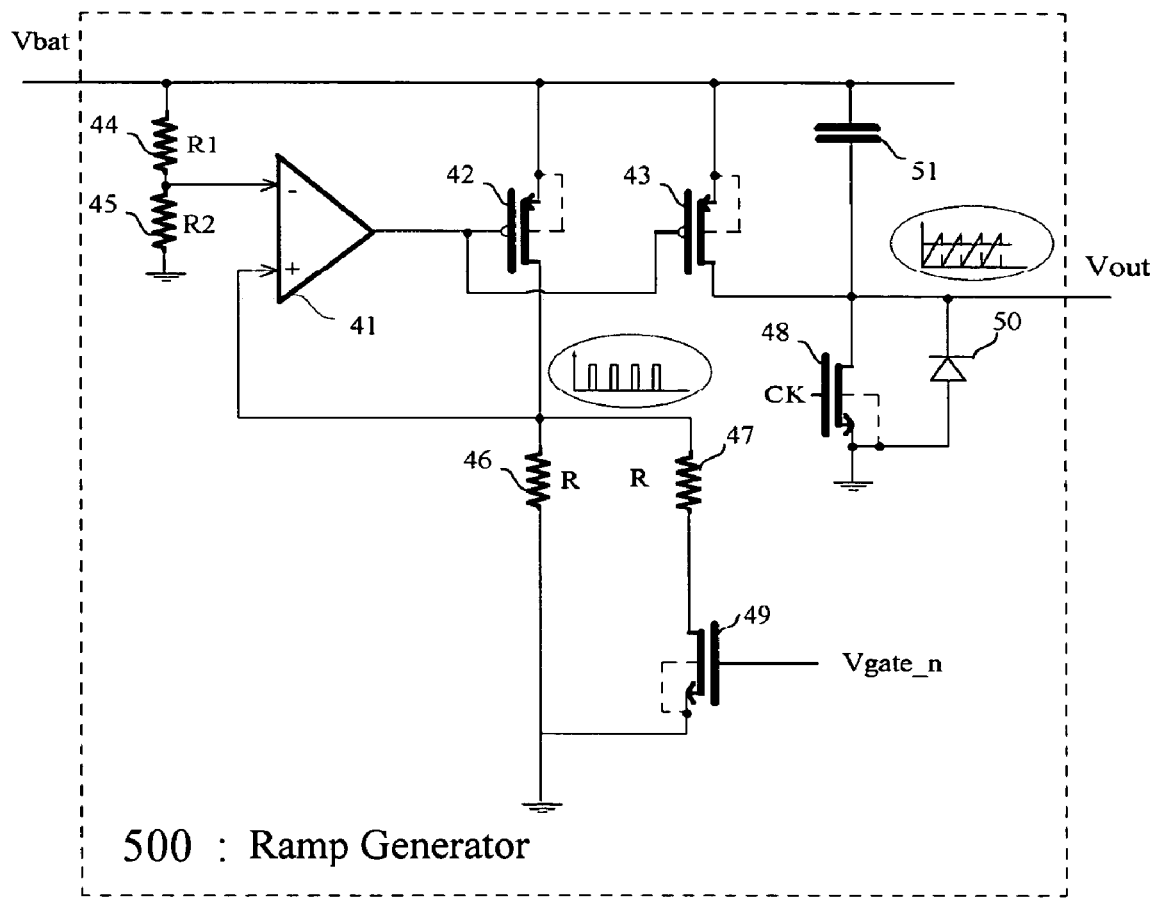
FIG. 4 illustrates a ramp generator in accordance with an embodiment of the present invention.

FIG. 4 illustrates a ramp generator 500 in accordance with an embodiment of the present invention. While the diagram illustrates an embodiment based on a set of positive supply voltages $V_{bat}$ and ground, one of ordinary skill in the art could readily adapt this embodiment to other voltage values, such as negative ones. Generator 500 comprises a differential amplifier 41 having an inverting input connected to the middle point of a bridge of resistors 44 and 45 (bearing values R1 and R2 respectively) that is connected between positive voltage $V_{bat}$ and ground voltage. Amplifier 41 comprises an output connected to the gate of a PMOS transistor 42 having a source connected to $V_{bat}$ and a drain connected to a non-inverting input of amplifier 41 and to a first electrode of a resistor 46 and to a first electrode of a resistor 47. Resistor 46 comprises a second electrode which is connected to ground while resistor 47 comprises a second electrode which is connected to the drain of an NMOS transistor 49, whose source is connected to ground. The gate of NMOS transistor 49 receives a control voltage $V_{gate\_n}$.

On a practical level, resistors 46 and 47 could be non-silicide polycrystalline silicon resistors (same material).

The gate of PMOS transistor 42 is also connected to the gate of another PMOS transistor 43, which acts as a current mirror. To this end, PMOS transistor 43 comprises a source connected to $V_{bat}$ and a drain connected to a first electrode of a capacitor 51 whose second electrode is connected to $V_{bat}$. In one preferred embodiment, capacitor 51 is implemented by the capacitance of a MOS-type transistor. Such an implementation is well known and therefore will not be further described.

The drain of PMOS transistor 43 is also connected to the drain of a NMOS-type transistor 48 whose source is connected to ground and whose gate receives a clock signal CK for periodically discharging capacitor 51.

The circuit of FIG. 4 can be adapted as required according to particular design constraints. In particular, additional transistors having specific functions could be added, such as to realize a circuit switch-off function that could be carried out by an additional PMOS-type transistor connected between the output of differential amplifier 41 and supply voltage $V_{bat}$.

As can be seen in FIG. 4, the ramp generator comprises two branches used as current divider, the first comprising resistor 46 and the second comprising resistor 47 and transistor 49 mounted in series. Resistors 46 and 47 can have equal values, although this is not compulsory.

When transistor 49 is not conducting, the set composed of both branches generally behaves like a resistor having a value R while, on the contrary, when transistor 49 is conducting, the set composed of both branches is the equivalent of a resistor of value R/2. Consequently, the set composed of both branches behaves like a variable resistive load that is controlled by gate voltage $V_{gate\_n}$.

The variable load sees a current that flows through transistor 42, which is also copied in PMOS transistor 43. This copy current charges capacitor 51, which can be discharged by transistor 48 at a rate set by the clock signal.

Figure 5:
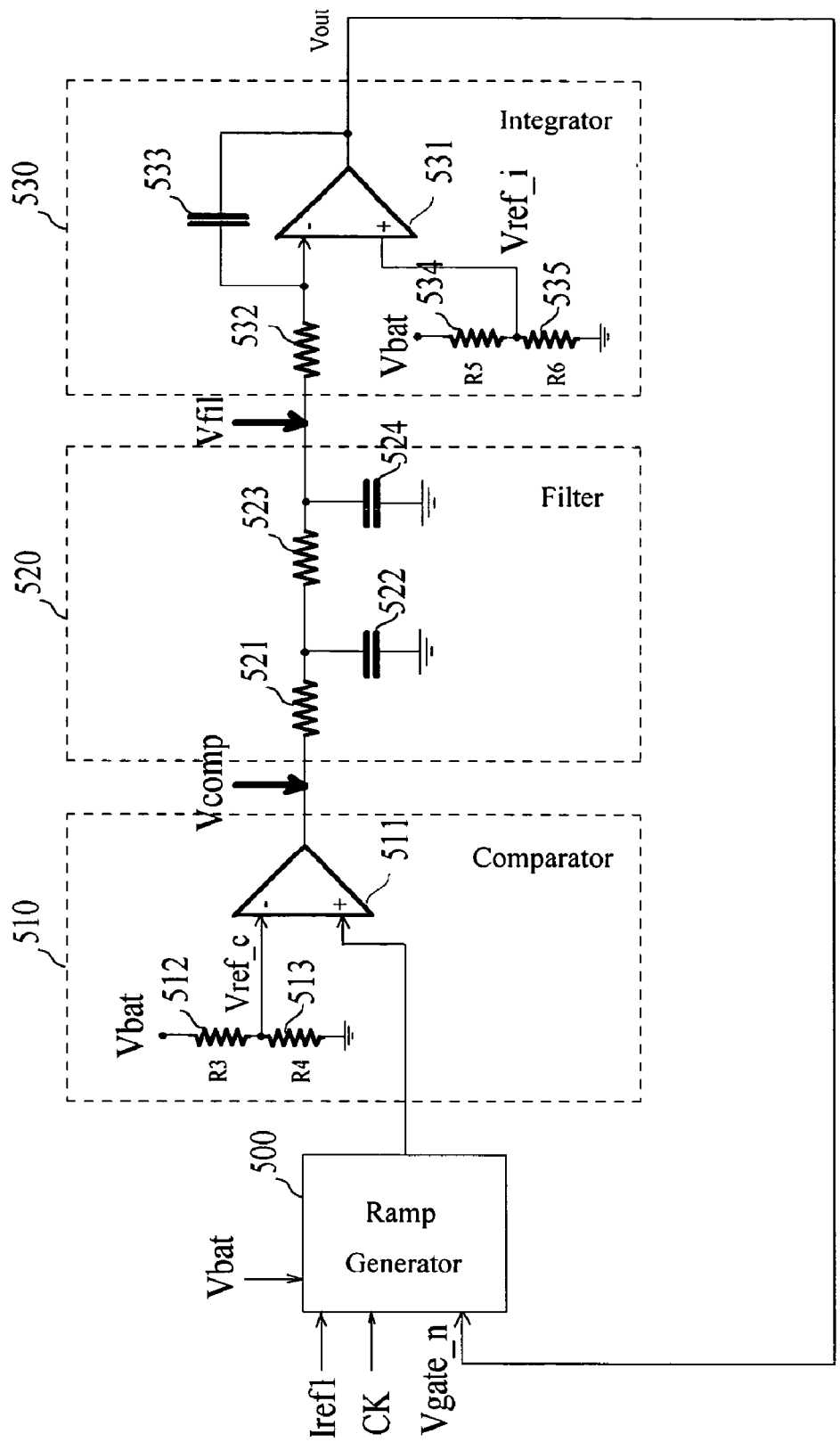
FIG. 5 illustrates of a preferred embodiment of a control loop that includes the ramp generator of FIG. 4.

FIG. 5 shows a preferred embodiment of a complete control loop that includes the ramp generator 500 of FIG. 4. The control loop that is connected at the output of the generator comprises a comparison block 510, a filtering block 520 and an integrating block 530.

Comparison block 510 comprises an amplifier 511—such as an operational amplifier for example—mounted as a comparator and receiving, on its non-inverting input, the voltage $V_{out}$ output from ramp generator 500. The inverting input of the comparator receives a reference voltage $V_{ref\_c}$ defined by the middle point of a bridge of resistors 512 (R3) and 513 (R4) assembled in series. Comparison block 510 outputs a voltage $V_{comp}$.

Filtering block 520 comprises, in this preferred embodiment, a second order low-pass filter made up of two RC circuits assembled in cascade, consisting of resistors 521 and 523, and capacitors 522 and 524, respectively. Filtering block 520 generates an output voltage $V_{fil}$.

Integrating block 530 comprises a differential amplifier 531 comprising an inverting input, a non-inverting input and an output generating output voltage $V_{out}$. The inverting input of the amplifier is connected to a first electrode of a resistor 532 whose second electrode receives voltage $V_{fil}$ output by filtering block 520. A capacitor 533 is connected between the inverting input and the output of amplifier 531. The inverting input of amplifier 531 receives a reference voltage $V_{ref\_i}$ which is defined by the middle point of a bridge made up of resistors 534 (R5) and 535 (R6), the bridge being connected between $V_{bat}$ voltage and ground.

The output $V_{out}$ of integrating block 530 is used to generate the control voltage of the gate of transistor 49 (block 500), which is carried out by a negative feedback loop.

The operation of the control carried out by the circuit of FIG. 5 will now be described. Initially, MOS transistor 49 is in an off state. So, the resistor seen by transistor 42 has a maximum value and, correlatively, the charging current of capacitor 51 is minimal. In turn, the slope of the ramp generated at the output of generator 500 is minimal and, a signal $V_{comp}$ results, whose average value is lower than what was expected. This value is filtered, then integrated via the integrator (which is also an inverter) and then, a noticeably higher voltage $V_{gate\_n}$ results.

This high value of voltage $V_{gate\_n}$ tends to make NMOS transistor 49 conductive, which then allows current to flow in the second branch of the current divider formed by resistors 46 and 47.

An increase in the total current flowing in transistor 42 results and, consequently there is an increase in the slope of ramp generator 500, which will tend towards its equilibrium point.

Control also works the other way around. Supposing that, for whatever reason, the slope of ramp generator 500 passes its point of equilibrium, that will cause comparator 511 to switch more quickly, which will generate a voltage $V_{comp}$ having a higher average value. After filtering by filtering block 520 and integration by integrating block 530, the output signal of integrating block 530, namely $V_{gate\_n}$, will decrease thus reducing the conduction of transistor 49. As the load resistor seen by transistor 42 increases, the intensity of the charging current of capacitor 51 is correspondingly reduced and, consequently, reduction of the value of the ramp's slope results.

Figure 6:
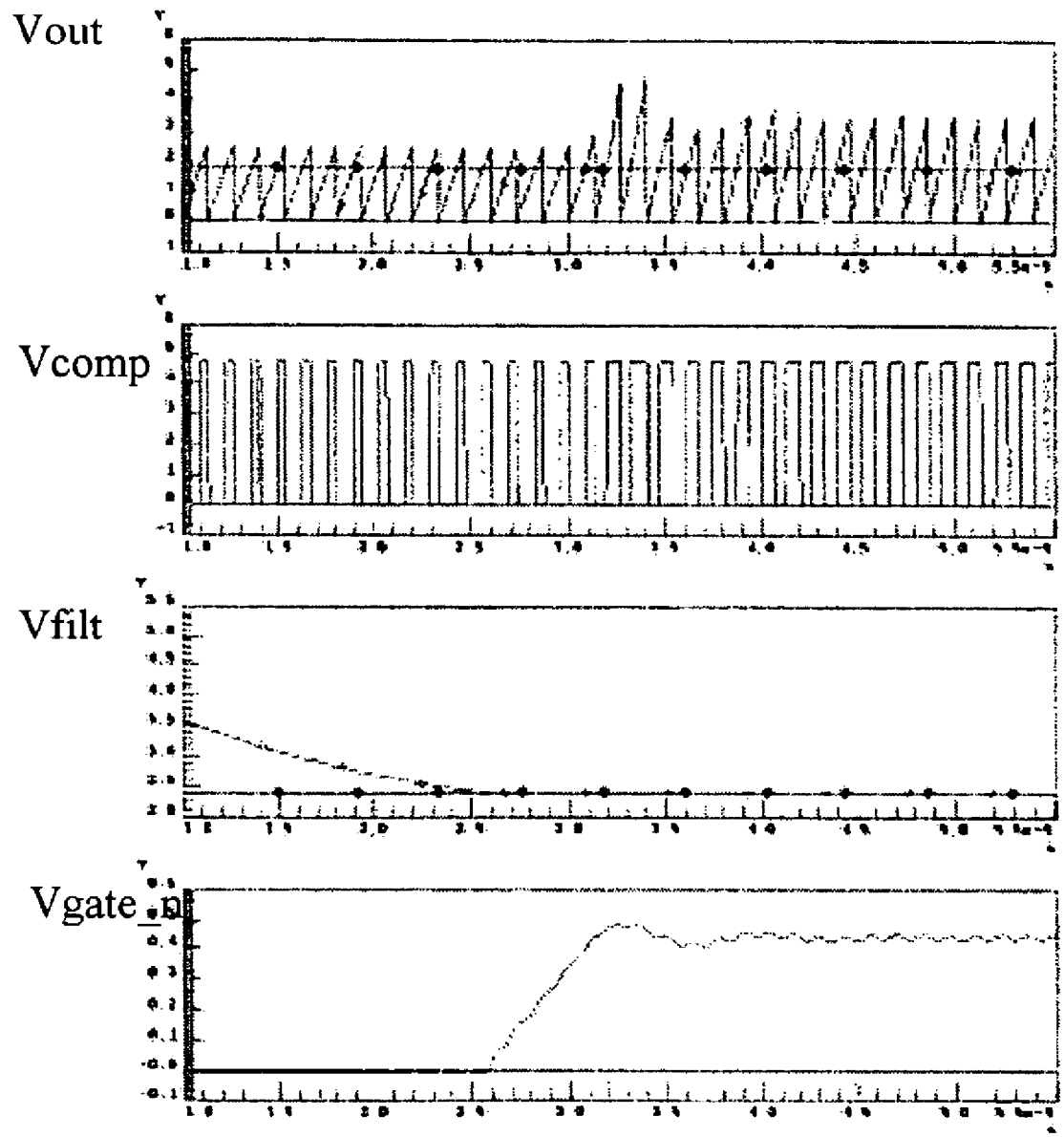
FIGS. 6 to 9 are chronograms illustrating the operation of the generator of FIGS. 4 and 5.

Thus, at the end of a transient state, which is particularly short—a few nanoseconds as illustrated in the chronogram of FIG. 6—the slope of the generator stabilizes to a value which is defined by a ratio of resistors and, becomes independent of the dispersion of active components and from temperature. That is particularly illustrated in FIG. 9 where distinct values of equilibrium for voltage $V_{gate\_n}$ are shown (proving the effectiveness of the control) whereas the generated slope corresponding to these values remains virtually identical and quite independent from characteristic dispersion and from temperature. For that, resistors R3, R4, R5 and R6 having a comparable nature are preferably selected.

For a given value of $V_{bat}$, it is noted that the slope depends only on a ratio A/B defined by the values of resistors R3, R4, R5 and R6 fixing both reference voltages of comparator 511 and amplifier 531 assembled as an integrator, according to the following relationships.

$$V_{out\ max} = A \times V_{bat}$$

$$R4/(R3+R4) = A/B$$

$$R6/(R5+R6) = (B-1)/B$$

The chronograms of FIGS. 6 through 9 illustrate successively voltages $V_{out}$, $V_{comp}$, $V_{filt}$, $V_{gate\_n}$, showing a simulation for a value $V_{bat}$=4.8 Volts and values A=0.75 and B=2.

More particularly, FIG. 6 illustrates the operation of the generator according to the present invention during the stabilization phase.

Figure 7:
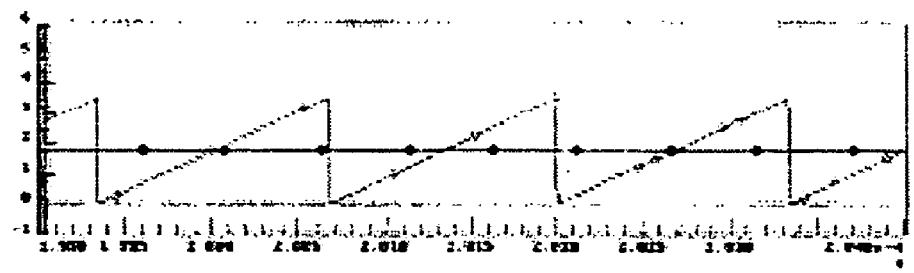
Figure 7:
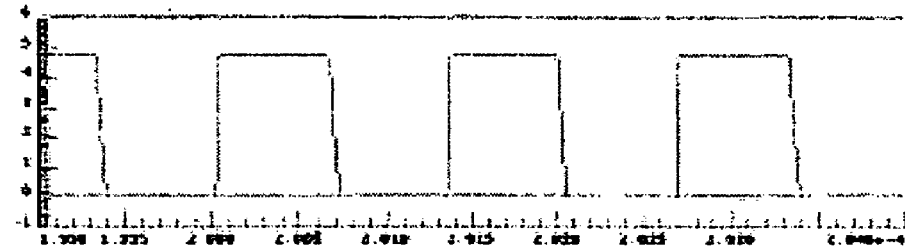
Figure 7:
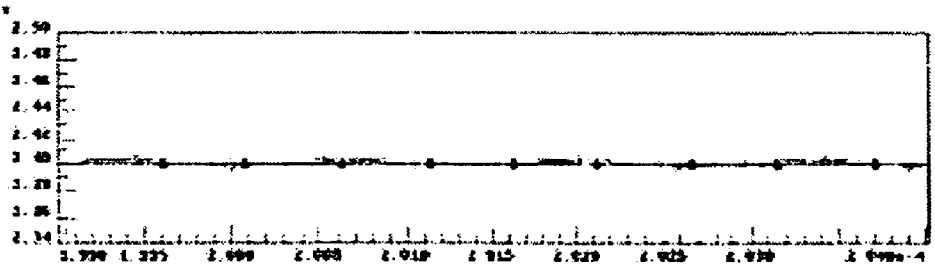
Figure 7:
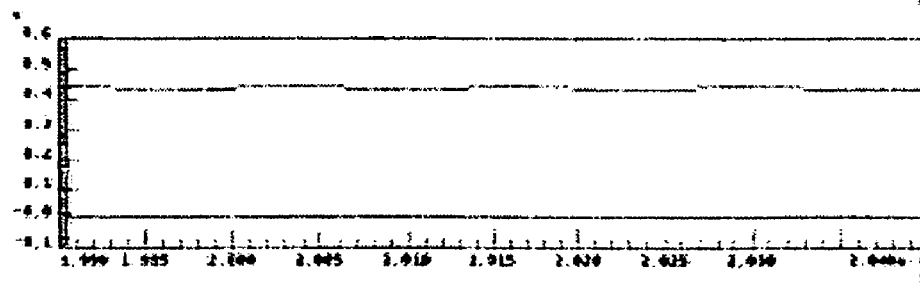

FIG. 7 illustrates the operation of the generator after the stabilization phase.

Figure 8:
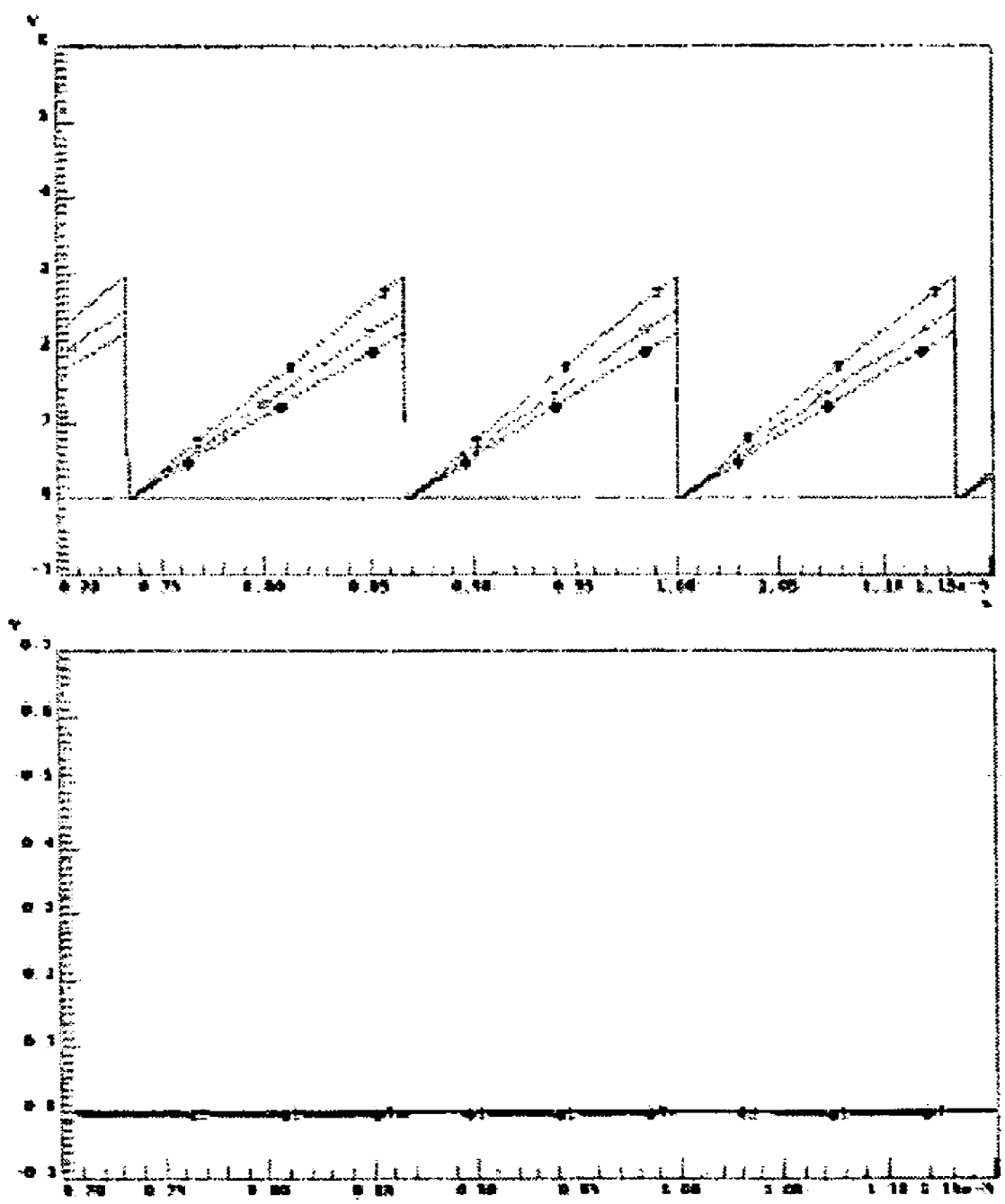

FIG. 8 illustrates the operation of the generator before the stabilization phase. Before stabilization, the behavior of the generator is that of a traditional ramp generator. The curves show a typical temperature of 27° C., and also two extreme temperatures, namely –25° C. and 125° C.

Figure 9:
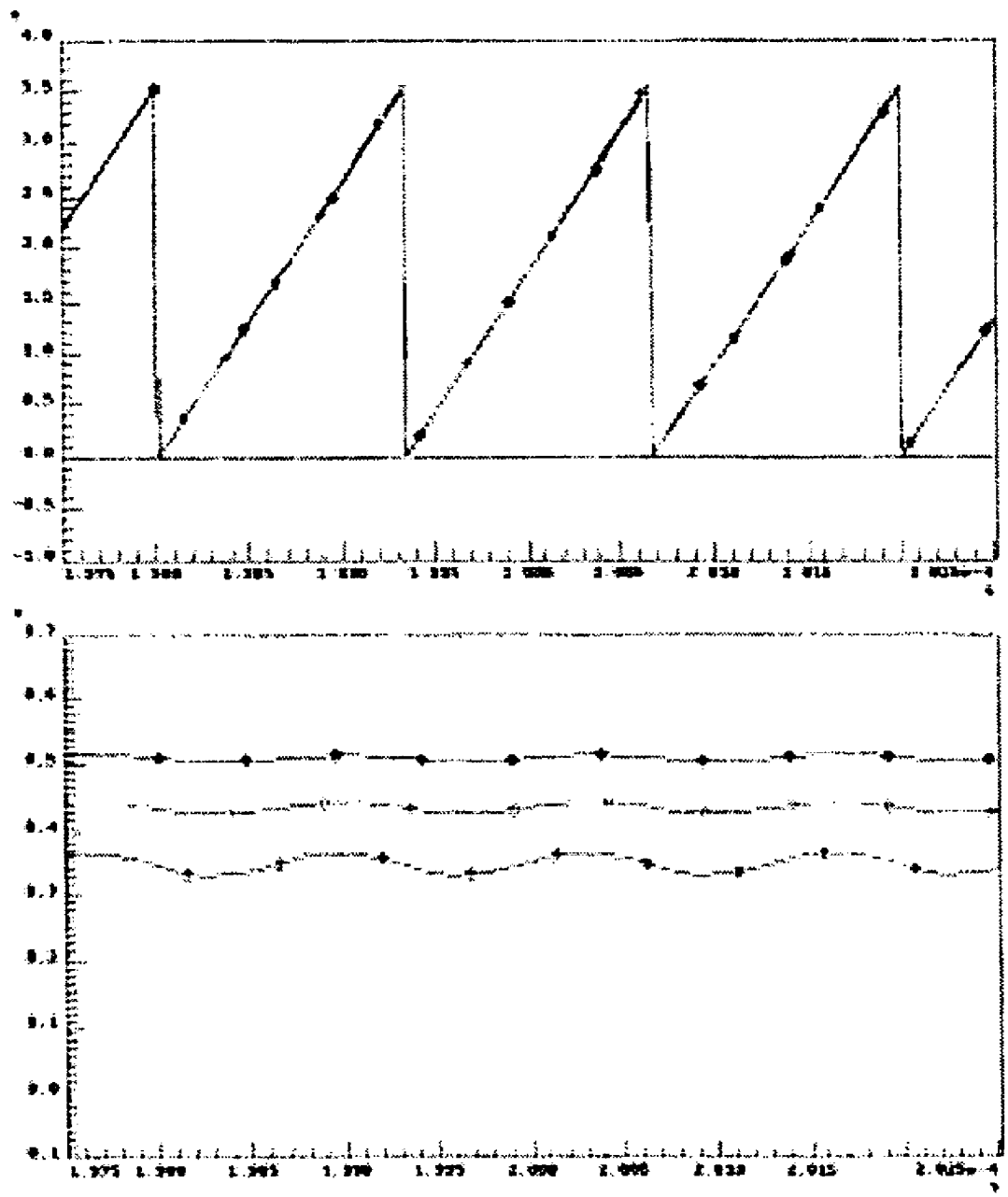

FIG. 9 illustrates the operation of the generator according to the present invention after stabilization, for the three previously mentioned temperature values.

The very short time required by the ramp generator to establish a definitive ramp is particularly advantageous. Indeed, it makes it possible to insert the ramp generator in a broader regulation loop—i.e., a loop having a larger time-constant—without being concerned with interference between both controls. This avoids instability problems due to the coexistence of two control loops. More generally, the very short time-constant of the ramp generator conditions the quality of the second regulation loop that will be implemented in the DC-DC converter, for example.

It is a considerable advantage of the present invention to allow the establishment of a steady state controlled in a very short time.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A ramp generator comprising:
an amplifier including an inverting input, a non-inverting input, and an output, the inverting input receiving a first reference voltage;
a first transistor including a gate electrode, a source electrode, and a drain electrode, the gate electrode being connected to the output of the amplifier, the source electrode being connected to a second reference voltage, and the drain electrode being connected to the non-inverting input of the amplifier;
a variable resistive load comprising a resistive circuit and a control electrode, the resistive circuit being connected between a third reference voltage and the drain electrode of the first transistor;
a load capacitor;
a second transistor mirroring the current of the first transistor, the second transistor being connected to the load capacitor so as to generate a copy current for charging the load capacitor;
a discharging circuit for discharging the load capacitor;
a comparison block including an input coupled to the load capacitor, the comparison block outputting a comparison signal;
a filtering block receiving the comparison signal, performing low-pass filtering, and outputting a filtered signal; and
an integrating block receiving the filtered signal and outputting an integrated value of the filtered signal, the integrated value being supplied to the control electrode of the variable resistive load.

2. A ramp generator comprising:
an amplifier including an inverting input, a non-inverting input, and an output, the inverting input receiving a first reference voltage;
a first transistor including a gate electrode, a source electrode, and a drain electrode, the gate electrode being connected to the output of the amplifier, the source electrode being connected to a second reference voltage, and the drain electrode being connected to the non-inverting input of the amplifier;
a variable resistive load comprising a resistive circuit and a control electrode, the resistive circuit being connected between a third reference voltage and the drain electrode of the first transistor;
a load capacitor;
a second transistor mirroring the current of the first transistor, the second transistor being connected to the load capacitor so as to generate a copy current for charging the load capacitor; and
a discharging circuit for discharging the load capacitor,
wherein the resistive circuit consists of a current divider comprising a first and a second branch, the first branch comprising a first resistor, and the second branch comprising a second resistor in series with a third transistor.

3. The ramp generator according to claim 2, wherein the first and second transistors are PMOS transistors, and that the third transistor is an NMOS transistor.

4. The ramp generator according to claim 2, further comprising:
a comparison block including an input coupled to the load capacitor, the comparison block outputting a comparison signal;
a filtering block receiving the comparison signal, performing low-pass filtering, and outputting a filtered signal; and
an integrating block receiving the filtered signal and outputting an integrated value of the filtered signal, the integrated value being supplied to the control electrode of the variable resistive load.

5. The ramp generator according to claim 4, wherein the comparison block comprises a second amplifier having an inverting input, a non-inverting input, and an output, the non-inverting input being coupled to the load capacitor, the inverting input receiving a fourth reference voltage, and the output generating the comparison signal.

6. The ramp generator according to claim 4, wherein the filtering block comprises two first order low-pass RC filters assembled in cascade.

7. The ramp generator according to claim 4, wherein the integrating block comprises:
  a differential amplifier including an inverting input, a non-inverting input, and an output;
  a third resistor having a first electrode receiving the filtered signal and a second electrode connected to the inverting input of the differential amplifier;
  a second capacitor connected between the inverting input and the output of the differential amplifier; and
  a voltage divider bridge generating a fifth reference voltage that is supplied to the non-inverting input of the differential amplifier.

8. A ramp generator comprising:
  an amplifier including an inverting input, a non-inverting input, and an output, the inverting input receiving a first reference voltage;
  a first transistor including a gate electrode, a source electrode, and a drain electrode, the gate electrode being connected to the output of the amplifier, the source electrode being connected to a second reference voltage, and the drain electrode being connected to the non-inverting input of the amplifier;
  a variable resistive load comprising a resistive circuit and a control electrode, the resistive circuit being connected between a third reference voltage and the drain electrode of the first transistor;
  a load capacitor;
  a second transistor mirroring the current of the first transistor, the second transistor being connected to the load capacitor so as to generate a copy current for charging the load capacitor; and
  a discharging circuit for discharging the load capacitor,
  wherein the resistive circuit comprises first and second resistors made of non silicide polycrystalline silicon, and the load capacitor is formed by another MOS transistor.

9. The ramp generator according to claim 2, wherein the first and second transistors are PMOS transistors.

10. A DC-DC converter including at least one ramp generator, the ramp generator comprising:
  an amplifier including an inverting input, a non-inverting input, and an output, the inverting input receiving a first reference voltage;
  a first transistor including a gate electrode, a source electrode, and a drain electrode, the gate electrode being connected to the output of the amplifier, the source electrode being connected to a second reference voltage, and the drain electrode being connected to the non-inverting input of the amplifier;
  a variable resistive load comprising a resistive circuit and a control electrode, the resistive circuit being connected between a third reference voltage and the drain electrode of the first transistor;
  a load capacitor;
  a second transistor mirroring the current of the first transistor, the second transistor being connected to the load capacitor so as to generate a copy current for charging the load capacitor;
  a discharging circuit for discharging the load capacitor;
  a comparison block including an input coupled to the load capacitor, the comparison block outputting a comparison signal;
  a filtering block receiving the comparison signal, performing low-pass filtering, and outputting a filtered signal; and
  an integrating block receiving the filtered signal and outputting an integrated value of the filtered signal, the integrated value being supplied to the control electrode of the variable resistive load.

11. The DC-DC converter according to claim 10, wherein the resistive circuit of the ramp generator consists of a current divider comprising a first and a second branch, the first branch comprising a first resistor, and the second branch comprising a second resistor in series with a third transistor.

12. The DC-DC converter according to claim 10, wherein the comparison block of the ramp generator comprises a second amplifier having an inverting input, a non-inverting input, and an output, the non-inverting input being coupled to the load capacitor, the inverting input receiving a fourth reference voltage, and the output generating the comparison signal.

13. The DC-DC converter according to claim 10, wherein the filtering block of the ramp generator comprises two first order low-pass RC filters assembled in cascade.

14. The DC-DC converter according to claim 10, wherein the integrating block of the ramp generator comprises:
  a differential amplifier including an inverting input, a non-inverting input, and an output;
  a third resistor having a first electrode receiving the filtered signal and a second electrode connected to the inverting input of the differential amplifier;
  a second capacitor connected between the inverting input and the output of the differential amplifier; and
  a voltage divider bridge generating a fifth reference voltage that is supplied to the non-inverting input of the differential amplifier.

15. A method for generating a ramp voltage signal, the method comprising the steps of:
  providing an amplifier that receives a first reference voltage;
  controlling a transistor with the output of the amplifier;
  varying a resistive load that is coupled to the transistor;
  mirroring the current of the transistor so as to generate a copy current for charging a load capacitor;
  discharging the load capacitor under control of a clock signal;
  comparing the ramp voltage signal with a second reference voltage and outputting a comparison signal;
  low-pass filtering the comparison signal and outputting a filtered signal;
  integrating the filtered signal and outputting an integrated value of the filtered signal; and
  using the integrated value to control resistance of the variable resistive load.

16. The method according to claim 15, wherein the step of varying the resistive load comprises supplying a control signal for increasing or decreasing resistance of the resistive load.

* * * * *